United States Patent
Endo

(10) Patent No.: US 11,046,046 B2
(45) Date of Patent: Jun. 29, 2021

(54) LAMINATE, METHOD FOR PRODUCING SAME, AND FLEXIBLE PRINTED CIRCUIT BOARD

(71) Applicant: ZEON CORPORATION, Tokyo (JP)

(72) Inventor: Mitsuteru Endo, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 40 days.

(21) Appl. No.: 15/760,312

(22) PCT Filed: Sep. 26, 2016

(86) PCT No.: PCT/JP2016/078257
§ 371 (c)(1),
(2) Date: Mar. 15, 2018

(87) PCT Pub. No.: WO2017/057269
PCT Pub. Date: Apr. 6, 2017

(65) Prior Publication Data
US 2018/0264779 A1    Sep. 20, 2018

(30) Foreign Application Priority Data

Sep. 28, 2015 (JP) .............................. JP2015-190387

(51) Int. Cl.
| | | |
|---|---|---|
| *B32B 3/00* | (2006.01) | |
| *B32B 7/02* | (2019.01) | |
| *B32B 15/08* | (2006.01) | |
| *B32B 37/04* | (2006.01) | |
| *B32B 15/085* | (2006.01) | |
| *H05K 3/02* | (2006.01) | |
| *B32B 27/32* | (2006.01) | |
| *B32B 7/12* | (2006.01) | |
| *B32B 27/08* | (2006.01) | |
| *H05K 1/03* | (2006.01) | |
| *H05K 3/46* | (2006.01) | |
| *B32B 37/00* | (2006.01) | |
| *B32B 33/00* | (2006.01) | |

(52) U.S. Cl.
CPC .................. *B32B 7/02* (2013.01); *B32B 7/12* (2013.01); *B32B 15/08* (2013.01); *B32B 15/085* (2013.01); *B32B 27/08* (2013.01); *B32B 27/325* (2013.01); *B32B 37/04* (2013.01); *H05K 1/0393* (2013.01); *H05K 3/022* (2013.01); *H05K 3/4652* (2013.01); *B32B 33/00* (2013.01); *B32B 2037/0092* (2013.01); *B32B 2250/02* (2013.01); *B32B 2307/30* (2013.01); *B32B 2307/732* (2013.01); *B32B 2307/734* (2013.01); *B32B 2457/08* (2013.01); *H05K 2201/068* (2013.01); *H05K 2203/068* (2013.01)

(58) Field of Classification Search
CPC .................................... B32B 3/00; H05K 3/00
See application file for complete search history.

(56) References Cited

U.S. PATENT DOCUMENTS

| | | | |
|---|---|---|---|
| 5,194,534 A | 3/1993 | Bell | |
| 2005/0106370 A1* | 5/2005 | Takai | .................. C23C 18/1608 |
| | | | 428/209 |
| 2009/0026934 A1* | 1/2009 | Fujita | ..................... C09J 123/20 |
| | | | 313/504 |
| 2013/0169912 A1 | 7/2013 | Ooishi et al. | |

FOREIGN PATENT DOCUMENTS

| | | | |
|---|---|---|---|
| EP | 0713893 | A1 | 5/1996 |
| EP | 1160272 | A1 | 12/2001 |
| EP | 2810971 | A1 | 12/2014 |
| JP | H05345817 | A | 12/1993 |
| JP | H0741550 | A | 2/1995 |
| JP | 2002020464 | A | 1/2002 |
| JP | 2002249553 | A | 9/2002 |
| JP | 2007016102 | A | 1/2007 |
| JP | 4973815 | B2 | 7/2012 |
| JP | 2012-214608 | * | 8/2012 |
| JP | 2012214606 | A | 11/2012 |
| JP | 2012214608 | A | 11/2012 |
| WO | 2012033076 | A1 | 3/2012 |

OTHER PUBLICATIONS

Apr. 15, 2019, the Extended European Search Report issued by the European Patent Office in the corresponding European Patent Application No. 16851440.4.

\* cited by examiner

*Primary Examiner* — Monique R Peets
(74) *Attorney, Agent, or Firm* — Kenja IP Law PC

(57) ABSTRACT

The invention is a laminate having a resin layer containing a crystalline alicyclic structure-containing resin and a metal layer in direct contact with the resin layer, wherein an average linear expansion coefficient of the resin layer at 60 to 100° C. is 5 to 50 ppm/° C., and a ten-point average roughness (Rz) on an interface between the resin layer and the metal layer is 2.0 μm or less, and a method for producing the laminate, and a flexible printed circuit board using the laminate.
One aspect of the invention provides a laminate which has a resin layer and a metal layer in direct contact with the resin layer and is suitably used as a substrate material, and a production method therefor, as well as a flexible printed circuit board using the laminate.

4 Claims, No Drawings

LAMINATE, METHOD FOR PRODUCING SAME, AND FLEXIBLE PRINTED CIRCUIT BOARD

TECHNICAL FIELD

The present invention relates to a laminate which has a resin layer and a metal layer in direct contact with the resin layer and is suitably used as a substrate material, a production method therefor, and a flexible printed circuit board using the laminate.

BACKGROUND ART

In recent years, alicyclic structure-containing resins have been investigated as electrical insulating materials.

For example, Patent Literature 1 discloses that a norbornene-based hydrogenated ring-opening polymer which is a type of alicyclic structure-containing resins is excellent in low water absorbability, low dielectric constant and the like and suitable as an electrical insulating material for forming a circuit board or the like.

However, the norbornene-based hydrogenated ring-opening polymer as disclosed in Patent Literature 1 tended to be poor in adhesiveness with metals and heat resistance, and required further improvement as a material for forming a circuit board.

Patent Literature 2 discloses that a norbornene-based hydrogenated ring-opening polymer having a melting point (i.e. having crystallinity) can be obtained by using a specific ring-opening polymerization catalyst, and that this norbornene-based hydrogenated ring-opening polymer having the crystallinity is excellent in mechanical strength and heat resistance.

However, this norbornene-based hydrogenated ring-opening polymer having crystallinity was also insufficient in adhesiveness with metals.

CITATION LIST

Patent Literature

Patent Literature 1: JP-A-7-41550
Patent Literature 2: JP-A-2002-20464

SUMMARY OF INVENTION

Technical Problem

As described above, there has been such a tendency that the resin layer containing the crystalline alicyclic structure-containing resin is poor in adhesiveness with another layer while being excellent in various properties. For this reason, roughening of this resin layer and interposition of an adhesive layer have been conventionally carried out, when producing a laminate including this resin layer.

However, there has been a problem that a circuit board obtained by using a laminate having a roughened resin layer and a metal layer has a large transmission loss and is unsuitable as a circuit board for high-frequency signals. Also, there has been a problem that when an adhesive layer is provided in a case of producing a thin laminate or the like, a thickness of the laminate is difficult to adjust and a laminate having a desired thickness is hardly obtained.

Consequently, there has been a demand for a laminate which has a resin layer containing a crystalline alicyclic structure-containing resin and a metal layer and is suitably used as a substrate material.

The present invention has been made in view of the above circumstances, and the object of the present invention is to provide a laminate which has a resin layer containing a crystalline alicyclic structure-containing resin and a metal layer and is suitably used as a substrate material, and a production method therefor, as well as a flexible printed circuit board using the laminate.

Solution to Problem

As a result of intensive studies in order to solve the above problems, the present inventor has found that a laminate having a resin layer containing a crystalline alicyclic structure-containing resin and a metal layer in direct contact with the resin layer, wherein an average linear expansion coefficient of the resin layer at 60 to 100° C. is within a specific range and a ten-point average roughness (Rz) on an interface between the metal layer and the resin layer is 2.0 μm or less, is suitable as a substrate material, and has completed the present invention.

Accordingly, one aspect of the invention provides laminates of the following [1] to [3], a laminate producing method of [4], and a flexible printed circuit board of [5].

[1] A laminate having a resin layer containing a crystalline alicyclic structure-containing resin and a metal layer in direct contact with the resin layer, wherein an average linear expansion coefficient of the resin layer at 60 to 100° C. is 5 to 50 ppm/° C., and a ten-point average roughness (Rz) on an interface between the resin layer and the metal layer is 2.0 μm or less.

[2] The laminate according to [1], wherein the alicyclic structure-containing resin is a hydrogenated dicyclopentadiene ring-opening polymer.

[3] The laminate according to [1] or [2], wherein a metal constituting the metal layer is copper.

[4] A method for producing the laminate according to any of the above [1] to [3], wherein a resin sheet containing the crystalline alicyclic structure-containing resin and having an average linear expansion coefficient of 5 to 50 ppm/° C. at 60 to 100° C. is fused with a metal foil having a surface with a ten-point average roughness (Rz) of 2.0 μm or less at temperature of ±50° C. of a melting point of the alicyclic structure-containing resin.

[5] A flexible printed circuit board using the laminate according to any of the above [1] to [3].

Advantageous Effects of Invention

One aspect of the invention provides a laminate which has a resin layer and a metal layer in direct contact with the resin layer and is suitably used as a substrate material, and a production method therefor, as well as a flexible printed circuit board using the laminate.

DESCRIPTION OF EMBODIMENTS

Hereinafter, the embodiments of the present invention will be classified into 1) laminate and production method therefor and 2) flexible printed circuit board, and described in detail.

1) Laminate and Production Method Therefor

The laminate according to one embodiment of the invention is a laminate having a resin layer containing a crystalline alicyclic structure-containing resin and a metal layer in direct contact with the resin layer, and characterized in that an average linear expansion coefficient of the resin layer at 60 to 100° C. is 5 to 50 ppm/° C., and a ten-point average roughness (Rz) on an interface between the metal layer and the resin layer is 2.0 μm or less.

(Resin Layer)

The resin layer constituting the laminate according to one embodiment of the invention contains a crystalline alicyclic structure-containing resin.

The crystalline alicyclic structure-containing resin is a polymer obtained by polymerizing a cycloolefin and is a polymer having an alicyclic structure in its molecule and having crystallinity (hereinafter referred to as "polymer (α)" in some cases). The "crystalline" means a property determined depending on the tactic structure of the polymer chain, i.e. a property that a melting point can be observed with a differential scanning calorimeter (DSC) by optimizing measurement conditions and the like.

As the polymer (α), a known polymer such as a hydrogenated dicyclopentadiene ring-opening polymer having syndiotacticity described in a brochure of WO 2012/033076, a hydrogenated dicyclopentadiene ring-opening polymer having isotacticity described in JP-A-2002-249553, and a hydrogenated norbornene ring-opening polymer described in JP-A-2007-16102 can be used.

The melting point of the polymer (α) is preferably 180 to 350° C., more preferably 200 to 320° C., and particularly preferably 220 to 300° C.

The polymer (α) having a melting point within this range has a good balance between formability and heat resistance.

As the polymer (α), a hydrogenated dicyclopentadiene ring-opening polymer having syndiotacticity (hereinafter referred to as "polymer (α1)" in some cases) is preferred, because the laminate according to one embodiment of the invention can be efficiently produced.

Although the degree of tactic structure of the polymer (α1) is not particularly limited, a polymer having a higher the degree of tactic structure is preferred because a resin layer excellent in heat resistance can be efficiently formed.

Specifically, a ratio of racemo diads in the repeating units obtained by subjecting dicyclopentadiene to ring-opening polymerization and subsequently to hydrogenation is preferably 51% or higher, more preferably 60% or higher, and particularly preferably 70% or higher.

The higher the ratio of racemo diads is, i.e. the higher the syndiotacticity is, the higher the melting point of the hydrogenated dicyclopentadiene ring-opening polymer is.

The ratio of the racemo dyads can be measured and quantified by $^{13}$C-NMR spectrum analysis. Specifically, $^{13}$C-NMR measurement is carried out by applying an inverse-gated decoupling method using orthodichlorobenzene-d4 as a solvent at 150° C., so that the ratio of the racemo diads can be determined from an intensity ratio between a signal derived from the meso diads at 43.35 ppm and a signal derived from the racemo diads at 43.43 ppm, with a peak of orthodichlorobenzene-d4 at 127.5 ppm as a reference shift.

Dicyclopentadienes include endo and exo stereoisomers, and both of them can be used as monomers in the present invention. Alternatively, only one of the isomers may be used alone, or an isomer mixture containing the endo stereoisomer and the exo stereoisomer in an arbitrary ratio may be used. In the present invention, it is preferable to increase the ratio of one stereoisomer, because the crystallinity of the polymer (α1) is increased and a resin layer more excellent in heat resistance can be more easily formed. For example, the ratio of endo or exo stereoisomer is preferably 80% or higher, more preferably 90% or higher, and even more preferably 95% or higher. Additionally, it is preferable that the ratio of the endo stereoisomer is high, because the polymer can be easily synthesized.

In synthesizing the polymer (α1), only dicyclopentadiene may be used as a monomer, or another monomer copolymerizable with dicyclopentadiene may be used. Examples of other monomers include norbornenes other than dicyclopentadiene, cyclic olefins, dienes and the like.

Another monomer is used in an amount of preferably 10 wt % or less, and more preferably 5 wt % or less based on the total amount of the monomers.

The degree of the syndiotacticity of the ring-opening polymer can be adjusted by selection of a type of the ring-opening polymerization catalyst, or the like.

The ring-opening polymerization catalyst used for synthesizing the polymer (α1) is not particularly limited as long as it allows ring-opening polymerization of dicyclopentadiene to obtain a ring-opening polymer having syndiotacticity. A preferable ring-opening polymerization catalyst is exemplified by a catalyst containing a metal compound represented by the following formula (1).

$$M(NR^1)X_{4-a}(OR^2)_a \cdot L_b \qquad (1)$$

In the formula (1), M represents a metal atom selected from Group 6 transition metal atoms of the periodic table, $R^1$ represents a phenyl group which may have a substituent at one or more of positions 3, 4 and 5, or a group represented by —CH$_2$R$^3$ (R$^3$ represents a group selected from a hydrogen atom, an alkyl group which may have a substituent and an aryl group which may have a substituent), $R^2$ represents a group selected from an alkyl group which may have a substituent and an aryl group which may have a substituent, X represents a group selected from a halogen atom, an alkyl group which may have a substituent, an aryl group which may have a substituent and an alkylsilyl group, and L represents an electron-donating neutral ligand. a represents 0 or 1, and b represents an integer of 0 to 2.

M represents a Group 6 transition metal atom the periodic table (chromium, molybdenum, tungsten), and molybdenum or tungsten is preferred, and tungsten is more preferred.

The number of the carbon atoms in the phenyl group which may have a substituent at one or more of positions 3, 4 and 5 represented by $R^1$ is not particularly limited, but is normally 6 to 20, and preferably 6 to 15.

Examples of the substituent include an alkyl group such as a methyl group and an ethyl group; a halogen atom such as a fluorine atom, a chlorine atom and a bromine atom; an alkoxy group such as a methoxy group, an ethoxy group and an isopropoxy group; and the like.

In addition, substituents at two or more of positions 3, 4 and 5 may be bound to each other to form a ring structure.

Examples of the phenyl group which may have a substituent at one or more of 3, 4, and 5 positions include an unsubstituted phenyl group; a monosubstituted phenyl group such as a 4-methylphenyl group, a 4-chlorophenyl group, a 3-methoxyphenyl group, a 4-cyclohexylphenyl group and a 4-methoxyphenyl group; a disubstituted phenyl group such as a 3,5-dimethylphenyl group, a 3,5-dichlorophenyl group, a 3,4-dimethylphenyl group and a 3,5-dimethoxyphenyl group; a trisubstituted phenyl group such as a 3,4,5-trimethylphenyl group and a 3,4,5-trichlorophenyl group; a 2-naphthyl group which may have a substituent such as a 2-naphthyl group, a 3-methyl-2-naphthyl group and a 4-methyl-2-naphthyl group; and the like.

In the group represented by —CH$_2$R$^3$ in R$^1$, R$^3$ represents a group selected from a hydrogen atom, an alkyl group which may have a substituent and an aryl group which may have a substituent.

The number of carbon atoms in the alkyl group which may have a substituent represented by $R^3$ is not particularly limited, but is normally 1 to 20, and preferably 1 to 10. This alkyl group may be linear or branched.

Examples of the substituent include a phenyl group which may have a substituent, such as a phenyl group and a 4-methylphenyl group; an alkoxyl group such as a methoxy group and an ethoxy group; and the like.

Examples of the alkyl group which may have a substituent represented by $R^3$ include a methyl group, an ethyl group, a propyl group, an isopropyl group, a butyl group, an isobutyl group, a t-butyl group, a pentyl group, a neopentyl group, a benzyl group, a neophyl group and the like.

The number of carbon atoms in the aryl group which may have a substituent represented by $R^3$ is not particularly limited, but is normally 6 to 20, and preferably 6 to 15.

Examples of the substituent include an alkyl group such as a methyl group and an ethyl group; a halogen atom such as a fluorine atom, a chlorine atom and a bromine atom; an alkoxy group such as a methoxy group, an ethoxy group and an isopropoxy group; and the like.

Examples of the aryl group which may have a substituent represented by $R^3$ include a phenyl group, a 1-naphthyl group, a 2-naphthyl group, a 4-methylphenyl group, a 2,6-dimethylphenyl group and the like.

Above all, the alkyl group having 1 to 20 carbon atoms is preferred as the group represented by $R^3$.

Examples of the halogen atom represented by X include a chlorine atom, a bromine atom and an iodine atom.

Examples of the alkyl group which may have a substituent and the aryl group which may have a substituent represented by X include the same groups as described for the alkyl group which may have a substituent and the aryl group which may have a substituent respectively, represented by $R^3$.

Examples of the alkylsilyl group represented by X include a trimethylsilyl group, a triethylsilyl group, a t-butyldimethylsilyl group, and the like.

In addition, when the metal compound represented by formula (1) has two or more Xs, they may be bound to each other to form a ring structure.

Examples of the alkyl group which may have a substituent and the aryl group which may have a substituent represented by $R^2$ include the same groups as described for the alkyl group which may have a substituent and the aryl group which may have a substituent respectively, represented by $R^3$.

The electron-donating neutral ligand represented by L is exemplified by an electron-donating compound containing a Group 14 or 15 atom the periodic table. Specific examples thereof include phosphines such as trimethylphosphine, triisopropylphosphine, tricyclohexylphosphine and triphenylphosphine; ethers such as diethyl ether, dibutyl ether, 1,2-dimethoxyethane and tetrahydrofuran; amines such as trimethylamine, triethylamine, pyridine and lutidine; and the like. Above all, ethers are preferable.

As the metal compound represented by formula (1), a tungsten compound having a phenylimide group (a compound in which M in the formula (1) represents a tungsten atom and $R^1$ represents a phenyl group) is preferred, and tetrachlorotungsten phenylimide (tetrahydrofuran) complex is more preferred.

In relation to the amount of the metal compound represented by formula (1) used in the ring-opening polymerization reaction, a molar ratio of (metal compound:monomer) is normally 1:100 to 1:2,000,000, preferably 1:500 to 1:1,000,000, and more preferably 1:1,000 to 1:500,000. If the amount of the metal compound is too large, it may be difficult to remove the metal compound after the reaction, and if it is too small, sufficient polymerization activity may not be obtained.

The metal compound represented by formula (1) can be obtained by production in accordance with a known method (e.g. a method described in JP-A-5-345817).

The ring-opening polymerization catalyst may consist only of the metal compound represented by the formula (1), or may be a combination of a metal compound represented by formula (1) and an organometallic reducing agent. Use of the metal compound represented by formula (1) in combination with the organometallic reducing agent improves polymerization activity.

Examples of the organometallic reducing agent include Group 1, 2, 12, 13 and 14 organometallic compounds the periodic table having a hydrocarbon group having 1 to 20 carbon atoms.

Examples of the organometallic compound include an organolithium such as methyllithium, n-butyllithium and phenyllithium; an organomagnesium such as butylethylmagnesium, butyloctylmagnesium, dihexylmagnesium, ethylmagnesium chloride, n-butylmagnesium chloride and allylmagnesium bromide; an organozinc such as dimethyl zinc, diethyl zinc and diphenyl zinc; an organoaluminum such as trimethylaluminum, triethylaluminum, triisobutylaluminum, diethylaluminum chloride, ethylaluminum sesquichloride, ethylaluminum dichloride, diethylaluminum ethoxide, diisobutylaluminum isobutoxide, ethylaluminum diethoxide and isobutylaluminum diisobutoxide; an organotin such as tetramethyltin, tetra (n-butyl) tin and tetraphenyltin; and the like.

Above all, the organoaluminum or the organotin is preferred.

When an organometallic reducing agent is used, it is used in an amount of preferably 0.1 to 100 mol, more preferably 0.2 to 50 mol, and particularly preferably 0.5 to 20 mol based on 1 mol of the metal compound represented by formula (1). If the amount of the organometallic reducing agent to be used is too small, the polymerization activity may not be sufficiently improved, and if it is too large, side reactions may readily occur.

The ring-opening polymerization reaction is normally carried out in an organic solvent. The organic solvent to be used is not particularly limited as long as it allows dissolution or dispersion of a ring-opening polymer or a hydrogenated product thereof under a predetermined condition and does not inhibit the ring-opening polymerization reaction or the hydrogenation reaction.

Examples of the organic solvent include aliphatic hydrocarbons such as pentane, hexane and heptane; alicyclic hydrocarbons such as cyclopentane, cyclohexane, methylcyclohexane, dimethylcyclohexane, trimethylcyclohexane, ethylcyclohexane, diethylcyclohexane, decahydronaphthalene, bicycloheptane, tricyclodecane, hexahydroindene and cyclooctane; aromatic hydrocarbons such as benzene, toluene and xylene; halogen-based aliphatic hydrocarbons such as dichloromethane, chloroform and 1,2-dichloroethane; halogen-based aromatic hydrocarbons such as chlorobenzene and dichlorobenzene and the like; nitrogen-containing hydrocarbons such as nitromethane, nitrobenzene and acetonitrile; ethers such as diethyl ether and tetrahydrofuran; a mixed solvent containing them in combination; and the like.

Above all, the aromatic hydrocarbons, the aliphatic hydrocarbons, the alicyclic hydrocarbons and the ethers are preferred as the organic solvent.

For the polymerization reaction system, a known activity modifier and molecular weight modifier may be added. An amount of the activity modifier or molecular weight modifier to be added is not particularly limited. The activity modifier is normally added in an amount of 0.01 to 100 mol % based on the metal compound represented by formula (1), and the molecular weight modifier is normally added in an amount of 0.1 to 50 mol % based on dicyclopentadiene.

The polymerization temperature is not particularly limited, but is normally within a range of −78 to +200° C., and preferably −30 to +180° C. The polymerization time is not particularly limited and depending on the reaction scale, but is normally within a range of 1 minute to 1000 hours.

The weight average molecular weight (Mw) of the dicyclopentadiene ring-opening polymer is not particularly limited, but is normally 1,000 to 1,000,000, and preferably 2,000 to 500,000. A ring-opening polymer having such a weight average molecular weight is subjected to hydrogenation reaction, so that a polymer (α1) having excellent balance between formability and heat resistance can be obtained. The weight average molecular weight of the ring-opening polymer can be adjusted by adjusting an addition amount or the like of the molecular weight modifier used in polymerization.

The molecular weight distribution (Mw/Mn) of the dicyclopentadiene ring-opening polymer is not particularly limited, but is normally 1.0 to 4.0, and preferably 1.5 to 3.5. A ring-opening polymer having such a molecular weight distribution is subjected to hydrogenation reaction, so that a polymer (α1) excellent in formability can be obtained. The molecular weight distribution of the ring-opening polymer can be adjusted depending on a method for adding the monomer or on a concentration of the monomer in polymerization reaction.

The weight average molecular weight (Mw) and the molecular weight distribution (Mw/Mn) of the dicyclopentadiene ring-opening polymer refer to polystyrene-equivalent values determined by gel permeation chromatography (GPC) using tetrahydrofuran as an eluent.

The ring-opening polymerization reaction can provide a dicyclopentadiene ring-opening polymer having syndiotacticity. When the reaction conditions are appropriately set in the hydrogenation reaction after the ring-opening polymerization reaction, normally the hydrogenation reaction does not change the tactic structure of the ring-opening polymer. Hence, the desired polymer (α1) can be obtained by subjecting this dicyclopentadiene ring-opening polymer having syndiotacticity to a hydrogenation reaction.

As the hydrogenation catalyst to be used, a homogeneous catalyst or a heterogeneous catalyst known as a hydrogenation catalyst for an olefin compound can be used.

Examples of the homogeneous catalyst include a catalyst including a combination of a transition metal compound and an alkali metal compound, such as cobalt acetate/triethylaluminum, nickel acetylacetonate/triisobutylaluminum, titanocene dichloride/n-butyllithium, zirconocene dichloride/sec-butyllithium and tetrabutoxy titanate/dimethylmagnesium; a noble metal complex catalyst such as dichlorobis(triphenylphosphine) palladium, chlorohydridocarbonyltris(triphenylphosphine) ruthenium, chlorohydridocarbonylbis(tricyclohexylphosphine) ruthenium, bis (tricyclohexylphosphine) benzylidine ruthenium (IV) dichloride and chlorotris (triphenylphosphine) rhodium; and the like.

Examples of the heterogeneous catalyst include a metal catalyst such as nickel, palladium, platinum, rhodium and ruthenium; and a solid catalyst prepared by allowing the metal to be supported by a support such as carbon, silica, diatomaceous earth, alumina and titanium oxide, such as nickel/silica, nickel/diatomaceous earth, nickel/alumina, palladium/carbon, palladium/silica, palladium/diatomaceous earth and palladium/alumina.

The hydrogenation reaction is normally carried out in an inert organic solvent. Examples of the inert organic solvent include aromatic hydrocarbons such as benzene and toluene; aliphatic hydrocarbons such as pentane and hexane; alicyclic hydrocarbons such as cyclohexane and decahydronaphthalene; ethers such as tetrahydrofuran and ethylene glycol dimethyl ether; and the like.

The inert organic solvent may be the same as the solvent used in the ring-opening polymerization reaction or may be different. In addition, a hydrogenation catalyst may be added as it is to the ring-opening polymerization reaction solution for hydrogenation reaction.

The reaction conditions for the hydrogenation reaction also vary depending on the hydrogenation catalyst to be used.

The reaction temperature is normally −20 to +250° C., preferably −10 to +220° C., and more preferably 0 to +200° C. If the reaction temperature is too low, the reaction rate may be too slow, and if the reaction temperature is too high, side reactions may occur.

The hydrogen pressure is normally 0.01 to 20 MPa, preferably 0.05 to 15 MPa, and more preferably 0.1 to 10 MPa. If the hydrogen pressure is too low, the reaction rate may be too slow, and if the hydrogen pressure is too high, a special device such as a high-pressure resistant reactor is required.

The reaction time is not particularly limited as long as the desired hydrogenation ratio can be achieved, but is normally 0.1 to 10 hours.

After the hydrogenation reaction, the desired polymer (α1) only has to be collected in accordance with a conventional method.

The hydrogenation ratio (ratio of the hydrogenated main chain double bond) in the hydrogenation reaction is not particularly limited, but is preferably 98% or higher, and more preferably 99% or higher. The higher the hydrogenation ratio is, the better the heat resistance of the obtained polymer (α1) is.

The resin layer constituting the laminate according to one embodiment of the invention may contain other components such as an additive in addition to the crystalline alicyclic structure-containing resin.

Examples of the other components include a resin other than the crystalline alicyclic structure-containing resin, an antioxidant, a crystal nucleator, a filler, a flame retardant, a flame retardant promoter, a colorant, an antistatic agent, a plasticizer, a UV absorber, a light stabilizer, a near infrared absorber, a lubricant and the like.

When the laminate according to one embodiment of the invention is used as a substrate material, the resin layer preferably contains an antioxidant.

Examples of the antioxidant include a phenol-based antioxidant, a phosphorus-based antioxidant, a sulfur-based antioxidant, and the like.

Examples of the phenol-based antioxidant include 3,5-di-t-butyl-4-hydroxytoluene, dibutylhydroxytoluene, 2,2'-methylenebis(6-t-butyl-4-methylphenol), 4,4'-butylidenebis(3-t-butyl-3-methylphenol), 4,4'-thiobis(6-t-butyl-3-methylphenol), α-tocopherol, 2,2,4-trimethyl-6-hydroxy-7-t-butylchroman, tetrakis[methylene-3-(3',5'-di-t-butyl-4'-hydroxyphenyl)propionate] methane and the like.

Examples of the phosphorus-based antioxidant include distearylpentaerythritol diphosphite, bis(2,4-ditertiary butylphenyl) pentaerythritol diphosphite, tris(2,4-ditertiary butylphenyl) phosphite, tetrakis(2,4-ditertiary butylphenyl)-4,4'-biphenyl diphosphite, trinonylphenyl phosphite, and the like.

Examples of the sulfur-based antioxidant include distearyl thiodipropionate, dilauryl thiodipropionate and the like.

The content of the crystalline alicyclic structure-containing resin in the resin layer constituting the laminate according to one embodiment of the invention is normally 50 wt % or more, preferably 60 wt % or more, and more preferably 80 wt % or more based on the whole resin layer. The more the content of the crystalline alicyclic structure-containing resin in the resin layer is, the better the low water absorbability, low dielectric constant and the like are, and preferred as an electrical insulating material for forming a circuit board or the like.

The contents of the other components can be appropriately determined depending on the purpose, but is normally less than 50 wt %, preferably less than 40 wt %, and more preferably less than 20 wt % based on the whole resin layer.

In addition, the content of the antioxidant is normally 0.001 to 5 wt %, preferably 0.01 to 4 wt %, and more preferably 0.1 to 3 wt % based on the whole resin layer.

The resin layer constituting the laminate according to one embodiment of the invention has an average linear expansion coefficient of 5 to 50 ppm/° C. at 60 to 100° C. The average linear expansion coefficient of the resin layer at 60 to 100° C. is preferably 10 to 45 ppm/° C., and more preferably 15 to 40 ppm/° C.

Normally, it is difficult to form a resin layer having an average linear expansion coefficient of lower than 5 ppm at 60 to 100° C. In addition, since a laminate having a resin layer having an average linear expansion coefficient of higher than 50 ppm at 60 to 100° C. is apt to be distorted due to change in temperature, a printed circuit board using such a laminate may cause disconnection or the like due to long-term use.

When producing a laminate using a resin film as described below, an average linear expansion coefficient of a resin layer at 60 to 100° C. can be adjusted so as to be a desired value by stretching the resin film.

The average linear expansion coefficient of the resin layer at 60 to 100° C. can be obtained by a thermomechanical analyzer (TMA).

The thickness of the resin layer is not particularly limited, and can be appropriately determined depending on the intended purpose of the laminate. The thickness of the resin layer is normally 1 to 250 μm, and preferably 5 to 150 μm.

The method for forming the resin layer will be described in the production method for the laminate.

(Metal Layer)

The metal layer constituting the laminate according to one embodiment of the invention includes a metal.

Examples of the metal constituting the metal layer include copper, gold, silver, stainless steel, aluminum, nickel, chromium and the like, and a combination of these metals. Above all, copper is preferred because a laminate useful as a substrate material can be obtained.

The thickness of the metal layer is not particularly limited, and can be appropriately determined depending on the intended purpose of the laminate. The thickness of the metal layer is normally 1 to 35 μm, and preferably 3 to 18 μm.

The method for forming the metal layer will be described in the production method for the laminate.

(Laminate)

The laminate according to one embodiment of the invention has the resin layer and the metal layer, in which the resin layer and the metal layer are in direct contact with each other.

"The resin layer and the metal layer are in direct contact with each other" means that there is not another layer such as an adhesive layer between the resin layer and the metal layer.

Conventionally, there have been cases that when a resin layer and a metal layer ware adhered to each other by using an adhesive layer or the like, a laminate having a desired thickness cannot be accurately produced as a result of the influence from the thickness of the adhesive layer. On the other hand, since the laminate according to one embodiment of the invention does not interpose an adhesive layer or the like, such a problem is not caused in producing the laminate according to one embodiment of the invention.

The laminate according to one embodiment of the invention has a ten-point average roughness (Rz) on the interface between the resin layer and the metal layer of 2.0 nm or less, preferably 0.01 to 1.5 μm, and more preferably 0.1 to 1.2 μm.

A laminate having a ten-point average roughness (Rz) on the interface between the metal layer and the resin layer of 2.0 μm or less is suitably used as a material for a printed circuit board having a small transmission loss.

The ten-point average roughness (Rz) can be determined in accordance with JIS B0601-1994.

For example, the laminate is cut with a microtome, its cross section is observed with a scanning electron microscope, and the ten-point average roughness (Rz) of the metal layer on the cross section is calculated. The ten-point average roughness calculated by this method is the ten-point average roughness (Rz) on the interface between the metal layer and the resin layer according to one embodiment of the invention.

Note that, as described below, when producing a laminate using a metal foil, the ten-point average roughness (Rz) on the metal foil surface can be deemed as the same as the ten-point average roughness (Rz) on the interface between the resin layer and the metal layer. In addition, when a laminate is produced in such a way that a metal layer is formed by plating treatment or the like on the resin sheet, the ten-point average roughness (Rz) on the resin sheet surface can be deemed as the same as the ten-point average roughness (Rz) on the interface between the resin layer and the metal layer.

The laminate according to one embodiment of the invention is suitably used as a substrate material, because it has a high thickness accuracy and is excellent in balance between thermal shock test resistance and transmissibility.

(Production Method for Laminate)

The production method for the laminate according to one embodiment of the invention is not particularly limited. It is exemplified by a method of fusing a resin sheet containing a crystalline alicyclic structure-containing resin with a metal foil at a predetermined temperature [method (1)], a method of forming a metal layer on a surface of a resin sheet containing a crystalline alicyclic structure-containing resin by plating treatment [method (2)], and the like, for example. Above all, the method (1) is preferred because a desired laminate can be efficiently produced.

The method (1) is exemplified by a production method for a laminate [method (1a)] having a step that a resin sheet containing a crystalline alicyclic structure-containing resin in which an average linear expansion coefficient at 60 to 100° C. is 5 to 50 ppm/° C. is fused with a metal foil having a ten-point average roughness (Rz) of 2.0 μm or less on a surface, at temperature of ±50° C. of a melting point of the alicyclic structure-containing resin.

The resin sheet used in the method (1a) (hereinafter referred to as "resin sheet (A)" in some cases) is finally formed into a resin layer of the laminate according to one embodiment of the invention. Thus, the resin sheet (A) contains an alicyclic structure-containing crystalline resin. In addition, the average linear expansion coefficient of the resin sheet (A) at 60 to 100° C. is 5 to 50 ppm/° C., preferably 10 to 45 ppm/° C., and more preferably 15 to 40 ppm/° C.

The production method for the resin sheet (A) is not particularly limited. For example, it can be obtained in such a way that a resin composition which contains a crystalline alicyclic structure-containing resin and, if desired, other components is formed into a sheet by a known forming method such as injection forming, extrusion forming, press forming, inflation forming, blow forming, calender forming, die-casting forming, compression forming and cast forming.

The resin sheet (A) is preferably subjected to stretching treatment or crystallization annealing treatment in order to enhance its crystallinity.

The thickness of the resin sheet (A) is not particularly limited, but is normally 1 to 250 μm, and preferably 5 to 150 μm.

The metal foil used in the method (1a) is finally formed into a metal layer according to one embodiment of the invention.

Examples of the metal foil include copper foil, gold foil, silver foil, stainless steel foil, aluminum foil, nickel foil, chromium foil and the like. Above all, copper foil is preferred because a laminate useful as a substrate material can be obtained.

The thickness of the metal foil is not particularly limited, but is normally 1 to 35 μm, and preferably 3 to 18 μm.

When the laminate is produced by the method (1a), the ten-point average roughness (Rz) on the surface of the metal foil to be used is the ten-point average roughness (Rz) on the interface between the resin layer and the metal layer constituting the laminate. Thus, the ten-point average roughness (Rz) on the surface of the metal foil is 2.0 μm or less, preferably 0.01 to 1.5 μm, and more preferably 0.1 to 1.2 μm.

In the method (1a), the resin sheet is fused with the metal foil at ±50° C. of the melting point of the alicyclic structure-containing resin constituting the resin sheet, preferably at ±40° C. of the melting point, and more preferably at temperature of ±30° C. of the melting point. If this temperature is too low, the laminate may be poor in peel strength, and if this temperature is too high, the desired laminate is difficult to produce with high thickness accuracy.

The fusion method is not particularly limited. The resin sheet can be fused with the metal foil by e.g. a method in which the resin sheet and the metal foil are laminated and heat-pressed (heat press method) and a method in which a laminate of the resin sheet and the metal foil is made to pass through between heat rolls (heat roll method), and above all, the heat press method is preferred.

Conditions other than the temperature for fusion are not particularly limited. For example, the heat press can be carried out under conditions that a press-bonding pressure is 0.1 to 5.0 MPa and a press-bonding time is 1 second to 60 minutes.

In addition, it is more preferred to carry out heat press under reduced pressure using a vacuum laminator or the like because voids can be reduced.

The heat press can be carried out using a known press machine having a press frame mold for forming a flat plate, or a press machine such as a sheet molding compound (SMC) and a bulk mold compound (BMC).

2) Flexible Printed Circuit Board

For the flexible printed circuit board according to one embodiment of the invention, the laminate according to one embodiment of the invention is used.

For this reason, the flexible printed circuit board according to one embodiment of the invention has a high thickness accuracy and is excellent in balance between thermal shock test resistance and transmissibility and thus particularly preferably used for transmitting high-frequency signals.

EXAMPLES

The present invention will be described below by way of Examples in more detail. Note that the invention is not limited to the following examples. Furthermore, in the following Examples and Comparative Examples, the units "parts" and "%" respectively refer to "parts by weight" and "wt %" unless otherwise indicated.

Measurement in each Example was carried out in accordance with the following methods.

[Glass Transition Temperature and Melting Point]

A differential scanning calorimetry was measured using a differential scanning calorimeter (product name: "DSC6220", manufactured by Hitachi High-Tech Science Corporation) at an increase rate of 10° C./min to measure the glass transition temperature and the melting point of the polymer.

[Weight Average Molecular Weight (Mw) and Molecular Weight Distribution (Mw/Mn)]

The weight average molecular weight (Mw) and the molecular weight distribution (Mw/Mn) were determined as polystyrene-equivalent values by gel permeation chromatography (GPC) using tetrahydrofuran as a solvent at 40° C. Measuring apparatus: Gel permeation chromatography (GPC) system "HLC-8220" (manufactured by Tosoh Corporation)
Column: "H-type column" (manufactured by Tosoh Corporation)

[Hydrogenation Ratio of Unsaturated Bonds in Polymer]

A hydrogenation ratio of unsaturated bonds in the polymer was determined on the basis of $^1$H-NMR measurement.

[Content of Functional Groups]

A content ratio of functional groups in the polymer (number of functional groups:number of repeating units in the polymer) was determined on the basis of $^1$H-NMR measurement.

[Linear Expansion Coefficient]

In relation to the linear expansion coefficients in an MD direction (Machine Direction) and a TD direction (Transverse Direction), the obtained film sample was cut out into a rectangular thin film sample of 20 mm in stretching direction×4 mm in stretching vertical direction, and then the linear expansion coefficient was measured using a thermo-mechanical analyzer (product name: "TMASS7100", manufactured by Hitachi High-Tech Science Corporation) at an increase rate of 5° C./minute. The linear expansion coefficient of each film was determined as an average value of the linear expansion coefficients in the MD direction and the TD direction.

Production Example 1

Synthesis of Hydrogenated Dicyclopentadiene Ring-Opening Polymer

To a metal pressure-resistant reactor whose inside had been replaced by nitrogen, 154.5 parts of cyclohexane, 42.8 parts of cyclohexane solution containing dicyclopentadiene (content of endo stereoisomers: 99% or more) (concentration: 70 mass %) (30 parts of dicyclopentadiene) and 1.9 parts of 1-hexene were added, and the whole content was heated to 53° C.

On the other hand, 0.061 part of n-hexane solution containing diethylaluminum ethoxide (concentration: 19 mass %) was added to a solution obtained by dissolving 0.014 part of tetrachlorotungsten phenylimide (tetrahydrofuran) complex in 0.70 part of toluene, and stirred for 10 minutes to prepare a catalyst solution. This catalyst solution was added to the reactor, and subjected to ring-opening polymerization reaction at 53° C. for 4 hours to obtain a solution containing a dicyclopentadiene ring-opening polymer.

To 200 parts of the resulting solution containing the dicyclopentadiene ring-opening polymer, 0.037 part of 1,2-ethanediol was added as a terminator, and the whole content was stirred at 60° C. for 1 hour to terminate the polymerization reaction. Subsequently, 1 part of a hydrotalcite-like compound (product name: "KYOWAAD (registered trademark) 2000", manufactured by Kyowa Chemical Industry Co., Ltd.) was added to the mixture, which was heated to 60° C., and stirred for 1 hour. 0.4 part of filter aid (product name: "Radiolite (registered trademark) #1500", manufactured by SHOWA CHEMICAL INDUSTRY CO., LTD.) was added to the mixture, and an adsorbent was filtered out using a PP pleated cartridge filter (product name: "TCP-HX", manufactured by Advantec Toyo Kaisha, Ltd.) to obtain a solution containing the dicyclopentadiene ring-opening polymer.

As a result of measuring the molecular weight of the dicyclopentadiene ring-opening polymer using a part of this solution, the weight average molecular weight (Mw) was 28,100, the number average molecular weight (Mn) was 8,750, and the molecular weight distribution (Mw/Mn) was 3.21.

To 200 parts of the solution containing the purified dicyclopentadiene ring-opening polymer (the content of the polymer was 30 parts), 100 parts of cyclohexane and 0.0043 part of chlorohydridocarbonyltris(triphenylphosphine) ruthenium were added, which was subjected to hydrogenation reaction at a hydrogen pressure of 6 MPa and 180° C. for 4 hours. The reaction solution was a slurry solution in which a solid content was precipitated.

The solid content was separated from the solution by centrifuging the reaction solution, and the solid content was dried under reduced pressure at 60° C. for 24 hours to obtain 28.5 parts of hydrogenated dicyclopentadiene ring-opening polymer.

The hydrogenation ratio of all unsaturated bonds in the hydrogenation reaction was 99% or higher, the glass transition temperature was 98° C., and the melting point was 262° C.

Production Example 2

Production of 50 μm-Thick Stretched Film of Crystalline Alicyclic Structure-Containing Resin [Resin Film (A1)]

100 parts of the hydrogenated dicyclopentadiene ring-opening polymer obtained in Production Example 1 was mixed with 0.8 part of antioxidant (tetrakis[methylene-3-(3', 5'-di-t-butyl-4'-hydroxyphenyl) propionate] methane, product name: "Irganox (registered trademark) 1010", manufactured by BASF Japan), and then the mixture was put into a twin-screw extruder (TEM-37B, manufactured by TOSHIBA MACHINE CO., LTD) and subjected to thermal melt extrusion to obtain a strand-shaped formed article, which was subsequently shredded by a strand cutter to obtain a pellet.

Operating conditions for the twin-screw extruder are shown below.

Set temperature of barrel: 270 to 280° C.
Set temperature of die: 250° C.
Rotation of screw: 145 rpm
Rotation of feeder: 50 rpm The resulting pellet was subjected to forming treatment under the following conditions to obtain a film formed article with a width of 120 mm and a thickness of 200 μm.

Forming machine: a thermal melt extruding film former equipped with a T-die (product name: "Measuring Extruder Type Me-20/2800 V3", manufactured by Optical Control Systems GmbH)
Set temperature of barrel: 280 to 290° C.
Temperature of die: 270° C.
Rotation of screw: 30 rpm
Rate for winding film: 1 m/minute A part of the resulting film formed article was cut out, then placed in a compact stretcher (product name "EX10-Type B", manufactured by Toyo Seiki Seisaku-sho, Ltd.), and sequentially biaxially stretched to obtain a stretched film. Subsequently, the stretched film was fixed to an iron plate and heated in an oven at 200° C. for 20 minutes to obtain a 50 μm-thick resin film (A1).

Operating conditions of the compact stretcher are shown below.

Rate of stretching: 10000 mm/min.
Temperature of stretching: 100° C.
Stretching ratio: Double in MD direction
Double in TD direction Production Example 3

Production of 25 μm-Thick Stretched Film of Crystalline Alicyclic Structure-Containing Resin [Resin Film (A2)]

In the same manner as Production Example 2, a 100 μm-thick film formed article was obtained in such a way that a 120 mm-wide film was wound up on a roll at a rate of 3 m/minute. A part of the film formed article obtained in this way was sequentially subjected to biaxial stretching treatment and heat treatment in the same manner as Production Example 2 to obtain a 25 μm-thick resin film (A2).

Production Example 4

Production of Film of Crystalline Alicyclic Structure-Containing Resin [Resin Film (A3)]

In the same manner as Production Example 2, a 50 μm-thick film formed article was obtained using a thermal melt extruding film former equipped with a T-die.

Subsequently, the resulting film formed article was subjected to crystallization annealing treatment at 200° C. to obtain a 50 μm-thick resin film (A3).

Production Example 5

Synthesis of Oxysilyl Group-Containing Polymer 550 parts of dehydrated cyclohexane, 25 parts of dehydrated styrene and 0.475 part of di-n-butyl ether were put into a reactor equipped with a stirrer, whose inside had been replaced by nitrogen, to which 0.68 part of cyclohexane solution containing n-butyllithium (concentration: 15%) was added while stirring the whole content at 60° C. to start a polymerization reaction. The reaction was carried out while continuing the stirring at 60° C. for 60 minutes, to which 50 parts of dehydrated isoprene was subsequently added, the reaction was continued at 60° C. for 30 minutes, to which 25 parts of dehydrated styrene was further added, and the reaction was continued at 60° C. for 30 minutes. Then, 0.5 part of isopropyl alcohol was added to terminate the reaction.

The resulting solution of styrene-isoprene-styrene triblock copolymer was transferred to a pressure-resistant reactor equipped with a stirrer, to which 1.5 parts of silica-alumina-supported nickel catalyst (trade name: "T-8400RL", manufactured by Sud-chemie catalyst Japan Inc.) and 50 parts of dehydrated cyclohexane were added and mixed. The inside of the reactor was replaced by hydrogen gas, to which hydrogen gas was subsequently supplied while stirring the whole content, and a hydrogenation reaction was carried out at 170° C. and 4.5 MPa for 6 hours.

The reaction solution was poured into a large amount of isopropyl alcohol to precipitate a polymer. The polymer was taken by filtration, washed, and then dried under reduced pressure at 60° C. for 24 hours.

The resulting polymer is a hydrogenated styrene-isoprene-styrene triblock copolymer, having a weight average molecular weight (Mw) of 65,300, a molecular weight distribution (Mw/Mn) of 1.06, and a hydrogenation ratio of the total unsaturated bonds (carbon-carbon unsaturated bonds in main chain and carbon-carbon unsaturated bonds in the aromatic ring) of 99% or higher.

Subsequently, 2.0 parts of vinyltrimethoxysilane and 0.2 part of di-t-butylperoxide were added to 100 parts of the resulting hydrogenated copolymer, and mixed. This mixture was kneaded using a twin-screw extruder (trade name: "TEM 37B", manufactured by TOSHIBA MACHINE CO., LTD) with a resin temperature of 210° C. and a detention time of 80 to 90 seconds to obtain an oxysilyl group-containing polymer. As a result of measuring a content ratio of functional groups (trimethoxysilyl groups) and a glass transition temperature for the oxysilyl group-containing polymer, the content ratio of the functional groups (number of functional groups:number of repeating units in the alicyclic structure-containing resin) was 1.4:100, and the glass transition temperature was 122° C.

Example 1

Both sides of the resin film (A1) obtained in Production Example 2 were overlapped with two 18 μm-thick rolled copper foils (trade name: BHY-22B-T, manufactured by JX Nippon Mining & Metals Corporation, Rz: 0.85 μm) so that the matte side of the foil faced to the resin film. Subsequently, this overlapped product was sandwiched between a pair of 1 mm-thick SUS plates, and then pressed using a manual hydraulic vacuum heating press (11FA, manufactured by Imoto Machinery Co., Ltd.) at 280° C. and 1 MPa for 10 minutes to obtain a laminate in which copper foils were respectively adhered to both sides of the resin film (A1).

Example 2

A laminate was obtained in the same manner as in Example 1 except that an 18 μm-thick electrolytic copper foil (trade name: CF-T4X-SV-18, manufactured by FUKUDA METAL FOIL & POWDER CO., LTD., Rz: 1.0 μm) was used.

Example 3

A laminate was obtained in the same manner as Example 1 except that the film was pressed at 250° C. and 1 MPa for 10 minutes.

Example 4

A laminate was obtained in the same manner as Example 1 except that the film was pressed at 310° C. and 1 MPa for 10 minutes.

Comparative Example 1

A laminate was obtained in the same manner as Example 1 except that the resin film (A3) was used.

Comparative Example 2

A laminate was obtained in the same manner as Example 1 except that an 18 μm-thick electrolytic copper foil (trade name: F3-WS, manufactured by FURUKAWA ELECTRIC CO., LTD., Rz: 2.4 μm) was used.

Comparative Example 3

Corona treatment was provided on both sides of the resin film (A2) obtained in Production Example 3 using a corona treater (Model A3 SW-FLNW, manufactured by WEDGE co., ltd.) under conditions that a distance between the discharge tube and the film was 1 mm, an output power was 0.06 kW, and a conveying speed was 1 m/minute.

A toluene solution containing 30% of the oxysilyl group-containing polymer obtained in Production Example 5 was applied on both sides of the corona-treated resin film obtained in this way using an applicator having a gap of 50 μm, and then this was heated in an oven at 150° C. for 5 minutes to form a 12 μm-thick adhesive layer (layer of an oxysilyl group-containing polymer) on one side of the corona-treated resin film.

Next, in the same manner, an adhesive layer was formed on the side without the adhesive layer in the corona-treated resin film to obtain a laminate film in which 12 μm-thick adhesive layers were formed on both sides of the corona-treated resin film.

Subsequently, the both sides of this laminate film were overlapped with two 18 μm-thick electrolytic copper foil (trade name: F3-WS, manufactured by FURUKAWA ELECTRIC CO., LTD., Rz: 2.4 μm) so that the matte side of the foil faced to the adhesive layer of the laminate film. Next, this overlapped product was sandwiched between a pair of 1 mm-thick SUS plates, and then pressed using a manual hydraulic vacuum heating press (11FA, manufactured by Imoto Machinery Co., Ltd.) at 200° C. and 1 MPa for 10 minutes to obtain a laminate in which copper foils were respectively adhered to both sides of the resin film (A2) via adhesive layers.

A thickness accuracy and an initial peel strength of the laminate obtained in each example were measured in accordance with the following method. In addition, an evaluation substrate having a through-hole daisy chain was made using the obtained laminate to conduct a thermal shock test. In addition, a transmissibility-evaluating substrate having a microstrip line was made to evaluate a transmissibility. These results are shown in Table 1.

[Thickness Accuracy]

The thicknesses of the laminates obtained in Examples and Comparative Examples were measured with a microgauge. A difference from the desired thickness 50 μm was evaluated in accordance with the following criteria, with the proviso that a thickness obtained by subtracting the thickness of the copper foil (18 μm×2) from the thickness of the laminate was taken as a thickness of the resin layer.

A: less than −5%
B: −5% or more to less than −10%
C: −10% or more

[Initial Peel Strength]

In accordance with JIS K6471 standard, a peel strength was measured as follows.

The laminates obtained in Examples and Comparative Examples were cut into a size of 25 mm×100 mm, and used as test pieces. A strip-shaped notch of 10 mm×100 mm was provided to the copper foil at the center of the test piece by a cutter. An end portion of the notched copper foil was peeled, and then the test piece was stuck to a 3 mm-thick FR-4 substrate by a double-sided adhesive tape. This was fixed to a tensile tester (Autograph AGS-5kNG, manufactured by Shimadzu Corporation) with a dedicated 90° peeling test jig, then a peel strength of the copper foil was measured at a rate of 50 mm/minute, and evaluated in accordance with the following criteria.

A: 8 N/cm or higher
B: 5 N/cm or higher to lower than 8 N/cm

[Thermal Shock Test]

The laminates obtained in Examples and Comparative Examples were cut into a size of 40 mm×80 mm, and then 10 lines×4 rows of through-holes with a drilled diameter of φ0.30 mm were provided. Subsequently, this was subjected to desmear treatment and reduction treatment, and then subjected to electroless copper plating and electrolytic copper plating so that an about 15 μm-thick conductor layer was formed on the side wall of the through hole, to obtain a substrate having the plated through-holes.

A dry film resist (RY3215, manufactured by Hitachi Chemical Co., Ltd.) was thermally laminated on both sides of the obtained substrate by a roll laminator, film masks printed with a predetermined conductor circuit pattern were placed on the both sides of the substrate, and then the substrate was exposed with a double side printer. Furthermore, the exposed resist was developed with a 1% sodium carbonate aqueous solution, a predetermined site was opened, then etched with ferric chloride, immersed in a 5% sodium hydroxide aqueous solution so that the resist was removed, to make four daisy chain circuits including 10 through holes.

Cables of the connection reliability evaluation system (MLR 21, manufactured by Kusumoto Chemicals, Ltd.) were connected to the four daisy chain circuits, then the test piece was set on an air-tank type thermal shock tester (WINTECH NT1200W, manufactured by Kusumoto Chemicals, Ltd.), and subjected to a thermal shock test up to 1000 cycles under conditions of a low-temperature tank at −45° C., a high-temperature tank at 125° C., and an exposure time of 15 minutes. The evaluation was carried out in accordance with the following criteria.

Good: There was no disconnection in 1000 cycles.
Bad: Disconnection was caused in any of the four daisy chain circuits in 1000 cycles.

[Transmissibility]

The laminates obtained in Examples and Comparative Examples were cut into a size of 60 mm×120 mm, then a microstrip line having a characteristic impedance of 50Ω was formed so as to have a length of 100 mm in the same method as for the evaluation substrate of the thermal shock test, the transmission loss at 40 GHz was measured using a vector network analyzer (model: MS37169, manufactured by Anritsu Corporation), and the transmission loss was evaluated in accordance with the following criteria.

A: loss of lower than −4 dB
B: loss of −4 dB or higher to less than −6 dB
C: loss of −6 dB or higher

TABLE 1

| | | Example 1 | Example 2 | Example 3 | Example 4 | Comparative Example 1 | Comparative Example 2 | Comparative Example 3 |
|---|---|---|---|---|---|---|---|---|
| Substrate | Type | Resin film (A1) | Resin film (A1) | Resin film (A1) | Resin film (A1) | Resin film (A3) | Resin film (A1) | Resin film (A2) |
| | Thickness (μm) | 50 | 50 | 50 | 50 | 50 | 50 | 25 |
| | Linear expansion coefficient | 30 ppm/° C. | 30 ppm/° C. | 30 ppm/° C. | 30 ppm/° C. | 82 ppm/° C. | 30 ppm/° C. | 29 ppm/° C. |
| Adhesive layer | Type | — | — | — | — | — | — | Oxysilyl group-containing hydrogenated copolymer |
| | Thickness (μm) | — | — | — | — | — | — | 12 |
| Copper foil | Type | Rolled copper foil | Electrolytic copper foil A | Electrolytic copper foil A | Electrolytic copper foil A | Electrolytic copper foil A | Electrolytic copper foil B | Electrolytic copper foil B |
| | Rz (μm) | 0.85 | 1.0 | 1.0 | 1.0 | 1.0 | 2.4 | 2.4 |
| Temperature for adhesion | ° C. | 280 | 280 | 250 | 310 | 280 | 280 | 200 |
| | Thickness accuracy of laminate | A | A | A | B | A | A | C |
| | Initial peel strength (N/cm) | B | A | B | A | A | A | A |
| | Thermal shock test | Good | Good | Good | Good | Bad | Good | Good |
| | Transmission loss (40 GHz) | A | B | B | B | B | C | C |

As seen from Table 1, the laminate according to one embodiment of the invention has a high thickness accuracy, is excellent in balance between thermal shock test resistance and transmissibility, and can be suitably used for a flexible printed circuit board for a high-frequency application.

The invention claimed is:

1. A laminate having a resin layer containing a crystalline alicyclic structure-containing resin and a metal layer in direct contact with the resin layer, wherein
   an average linear expansion coefficient of the resin layer at 60 to 100° C. is 5 to 50 ppm/° C.,
   a ten-point average roughness (Rz) on an interface between the resin layer and the metal layer is 2.0 μm or less,
   the crystalline alicyclic structure-containing resin is a hydrogenated dicyclopentadiene ring-opening polymer, and
   a content of the crystalline alicyclic structure-containing resin in the resin layer is 50 wt % or more.

2. The laminate according to claim 1, wherein a metal constituting the metal layer is copper.

3. A method for producing the laminate according to claim 1, wherein
   a resin sheet containing a crystalline alicyclic structure-containing resin and having an average linear expansion coefficient of 5 to 50 ppm/° C. at 60 to 100° C. is fused with a metal foil having a surface with a ten-point average roughness (Rz) of 2.0 μm or less at temperature of ±50° C. of a melting point of the alicyclic structure-containing resin, and
   the crystalline alicyclic structure-containing resin is a hydrogenated dicyclopentadiene ring-opening polymer.

4. A flexible printed circuit board using the laminate according to claim 1.

* * * * *